(12) United States Patent
Iida

(10) Patent No.: US 11,163,012 B2
(45) Date of Patent: Nov. 2, 2021

(54) ENERGIZATION EVALUATION TEST EQUIPMENT OF A PWM CONVERTER INPUT FILTER

(71) Applicant: Toshiba Mitsubishi-Electric Industrial Systems Corporation, Chuo-ku (JP)

(72) Inventor: Ryo Iida, Tokyo (JP)

(73) Assignee: Toshiba Mitsubishi—Electric Industrial Systems Corporation, Chuo-ku (JP)

( * ) Notice: Subject to any disclaimer, the term of this patent is extended or adjusted under 35 U.S.C. 154(b) by 277 days.

(21) Appl. No.: 16/273,430

(22) Filed: Feb. 12, 2019

(65) Prior Publication Data

US 2019/0173371 A1 Jun. 6, 2019

Related U.S. Application Data

(63) Continuation of application No. PCT/JP2016/074640, filed on Aug. 24, 2016.

(51) Int. Cl.
*G01R 1/30* (2006.01)
*H02M 1/12* (2006.01)
(Continued)

(52) U.S. Cl.
CPC ........... *G01R 31/40* (2013.01); *G01R 1/30* (2013.01); *H02M 1/00* (2013.01); *H02M 1/12* (2013.01); *H02M 7/217* (2013.01); *H03K 7/08* (2013.01)

(58) Field of Classification Search
CPC .......... H02M 1/12; H02M 1/00; H02M 7/217; H02M 1/126; H02M 5/4585; G01R 1/00;
(Continued)

(56) References Cited

U.S. PATENT DOCUMENTS

2014/0063877 A1   3/2014  Taira
2015/0016155 A1*  1/2015  Lee .................. H02M 1/12
                                                    363/44
2015/0145523 A1   5/2015  Harada

FOREIGN PATENT DOCUMENTS

CN    102116850 A    7/2011
CN    103858331 A    6/2014
(Continued)

OTHER PUBLICATIONS

International Search Report dated Nov. 15, 2016 in PCT/JP2016/074640, filed on Aug. 24, 2016.

*Primary Examiner* — Son T Le
(74) *Attorney, Agent, or Firm* — Oblon, McClelland, Maier & Neustadt, L.L.P.

(57) ABSTRACT

An energization evaluation test equipment for an input filter of a large capacity PWM converter by reducing the power supply capacity to the equipment under test is provided. The energization evaluation test is equivalent to an actual load test. An equipment under test has an input filter connected to an output terminal of an AC power source and a PWM converter connected to an output terminal of the input filter to convert an AC power source to a DC power source. The evaluation test equipment includes a PWM converter input filter and a PWM converter configured similarly to the PWM converter input filter and the PWM converter of the equipment under test, respectively, a direct current reactor connected to an output terminal of a PWM converter of the equipment under test, a PWM controller for controlling the PWM converter of the equipment under test and controlling the PWM converter of the energization evaluation test equipment, wherein, outputs of the PWM converter of the equipment under test and the PWM converter of the energization evaluation test equipment are connected in series via the direct current reactor, and the PWM controller is (Continued)

performed so that the output voltage of the PWM converter of the equipment under test becomes a desired value and the output current of the PWM converter of the energization evaluation test equipment becomes a desired value.

2 Claims, 5 Drawing Sheets

(51) Int. Cl.
*G01R 31/40* (2020.01)
*H02M 1/00* (2006.01)
*H02M 7/217* (2006.01)
*H03K 7/08* (2006.01)

(58) Field of Classification Search
CPC ........ G01R 31/00; G01R 31/50; G01R 31/40; G01R 1/30; G01R 31/3275; H03K 7/08
See application file for complete search history.

(56) References Cited

FOREIGN PATENT DOCUMENTS

| | | | |
|---|---|---|---|
| CN | 204304807 U | | 4/2015 |
| JP | 60-74933 | | 4/1985 |
| JP | 4-264271 | | 9/1992 |
| JP | 07095724 A | * | 4/1995 |
| JP | 11-299263 | | 10/1999 |
| JP | 2004-104891 | | 4/2004 |
| JP | 2004-201360 | | 7/2004 |
| JP | 2009-232541 | | 10/2009 |
| JP | 2015-106948 | | 6/2015 |
| WO | WO 2013/018185 A1 | | 2/2013 |

* cited by examiner

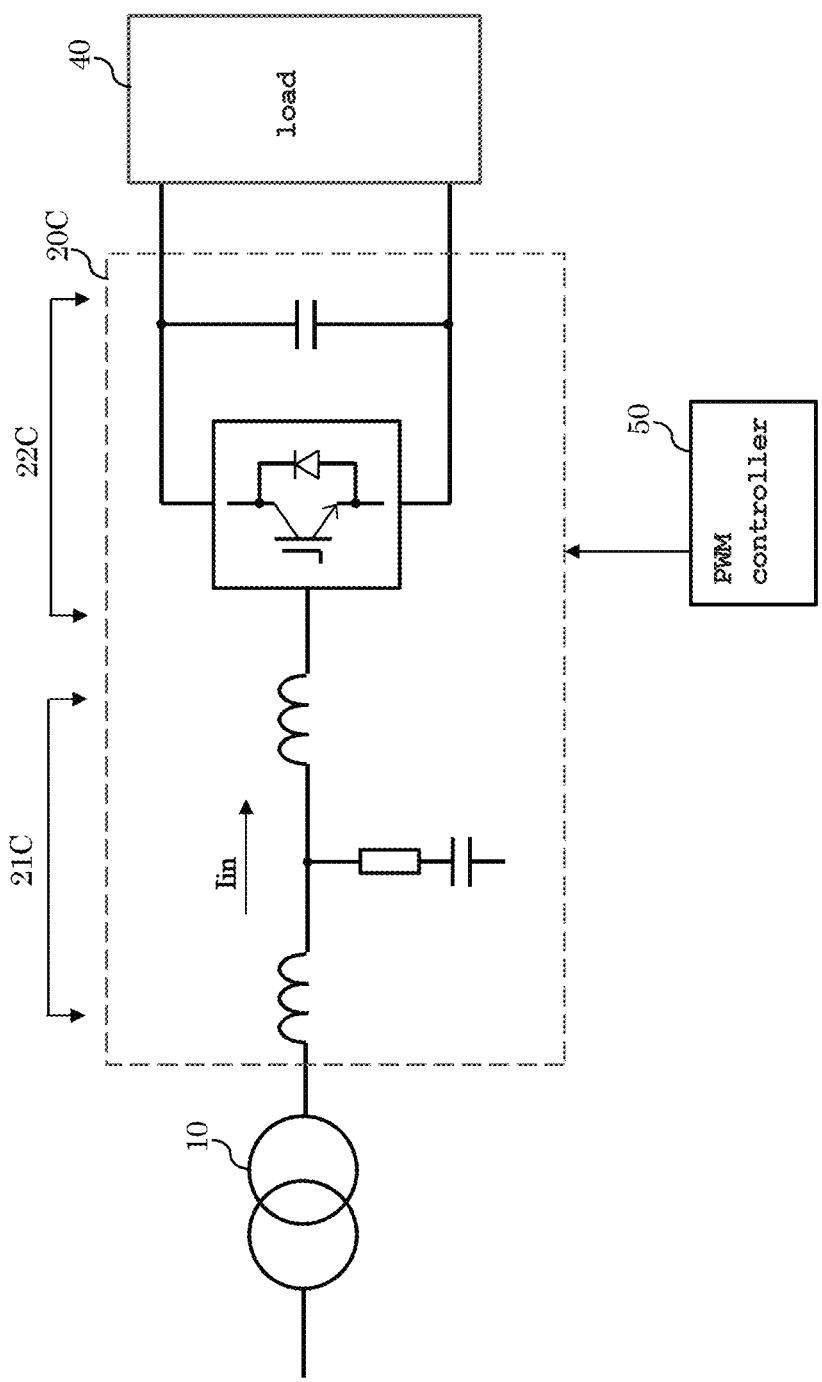
FIG. 5 --Prior Art--

US 11,163,012 B2

ENERGIZATION EVALUATION TEST EQUIPMENT OF A PWM CONVERTER INPUT FILTER

CROSS-REFERENCE TO RELATED APPLICATION

This application is based upon and claims the benefit of priority from the prior PCT patent application No. PCT/JP2016/74640, filed on Aug. 24, 2016, the entire contents of which are incorporated herein by reference.

TECHNICAL FIELD

The embodiment of the present invention relates to an energization evaluation test equipment of a PWM converter input filter.

BACKGROUND ART

In a PWM converter, an input filter is provided for harmonic suppression. However, when a large-capacity PWM converter is used as a common converter, it is sometimes difficult to evaluate energization at a rated voltage and a rated current for the input filter due to constraints on a power supply equipment capacity.

FIG. 5 is a block diagram showing a method of testing energization of a PWM converter input filter according to a conventional load energization method. In the illustrated example an apparatus for conducting energization evaluation test includes a transformer 10, a PWM converter filter 21C, a PWM converter 22C, a PWM controller 50, and a load 40. The transformer 10 converts an AC voltage supplied from power system into an AC voltage suitable for driving the load 40. The PWM converter input filter 21C prevent harmonics of the PWM converter 22C from diffusing into the power system. The PWM converter input filter 21C also suppresses harmonics of the AC voltage supplied from the power system via the transformer 10. The PWM converter 22C includes a plurality of switching elements (for example, IGBT), diodes, and a capacitor for smoothing DC voltage, and is controlled by a PWM controller 50 to be described later. The PWM converter 22C converts an AC voltage outputted from the PWM converter input filter 21C, to a DC voltage. The PWM controller 50 controls the gate G of switching elements (for example, IGBT) of the PWM converter, and converts above-described AC voltage into DC voltage.

In the case of the illustrated example, in order to conduct the energization evaluation test of the PWM converter input filter 21C, the rated voltage and the rated current are supplied to the load 40, and the energization evaluation test of the PWM converter input filter 21C is performed. (For example, refer to Patent Document 1.) In the evaluation method, for example, when the rated voltage and the rated current is supplied to the load 40, a temperature rise of the PWM converter input filter 21C is measured. When the temperature rise of the PWM converter input filter 21C falls within a predetermined range, it is determined to be normal. On the other hand, when the temperature rise is not within the predetermined range, it is determined that there is some abnormality.

PRIOR ART DOCUMENT

Patent Document

Patent Document 1: Japanese Patent Application Publication No. 2009-232541

SUMMARY OF THE INVENTION

Problem to be Solved by the Invention

However, in the large-capacity PWM converter used as a common converter, there is a problem that it is difficult to evaluate the energization at a rated voltage and a rated current with respect to the input filter due to restriction of power supply equipment capacity. In addition, there is a case that it is difficult to evaluate the energization using an actual load.

The present invention has been made to solve above-described problem, and it is an object of the present invention to provide a energization evaluation test equipment for a PWM converter input filter which can perform the energization evaluation test of the input filter for a large-capacity PWM converter with a rated voltage and a rated current, and to provide the energization evaluation test equivalent at the actual load.

Means For Solving The Problem

In order to achieve the above object, the energization evaluation test equipment of a PWM converter input filter according to the present invention is the test equipment for a PWM converter input filter of an equipment under test having an input filter connected to an output terminal of an AC power source and a PWM converter connected to an output terminal of the input filter to convert an AC power source to a DC power source, the evaluation test equipment comprises a PWM converter input filter and a PWM converter configured similarly to the PWM converter input filter and the PWM converter of the equipment under test, respectively, a direct current reactor connected to an output terminal of a PWM converter of the equipment under test, a PWM controller for controlling the PWM converter of the equipment under test and controlling the PWM converter of the energization evaluation test equipment; wherein, outputs of the PWM converter of the equipment under test and the PWM converter of the energization evaluation test equipment are connected in series via the direct current reactor, and the PWM controller is performed so that the output voltage of the PWM converter of the equipment under test becomes a desired value and the output current of the PWM converter of the energization evaluation test equipment becomes a desired value.

Effects of the Invention

According to the present invention, an energization evaluation test equipment can be provided even when the capacity of the power supply facility cannot be secured. It is possible to evaluate the energization evaluation of the input filter for the PWM converter, which enables the energization evaluation test at a rated voltage and a rated current for the input filter of the large capacity PWM converter. And the energization evaluation test is equivalent to an actual load test.

BRIEF DESCRIPTION OF THE DRAWINGS

FIG. 5 A block diagram showing a method of evaluating energization of a PWM converter input filter according to a conventional load energization method.

EMBODIMENT TO PRACTICE THE INVENTION

Hereinafter, embodiment of the present invention will be described with reference to the drawings.

Embodiment 1

Figure 1:
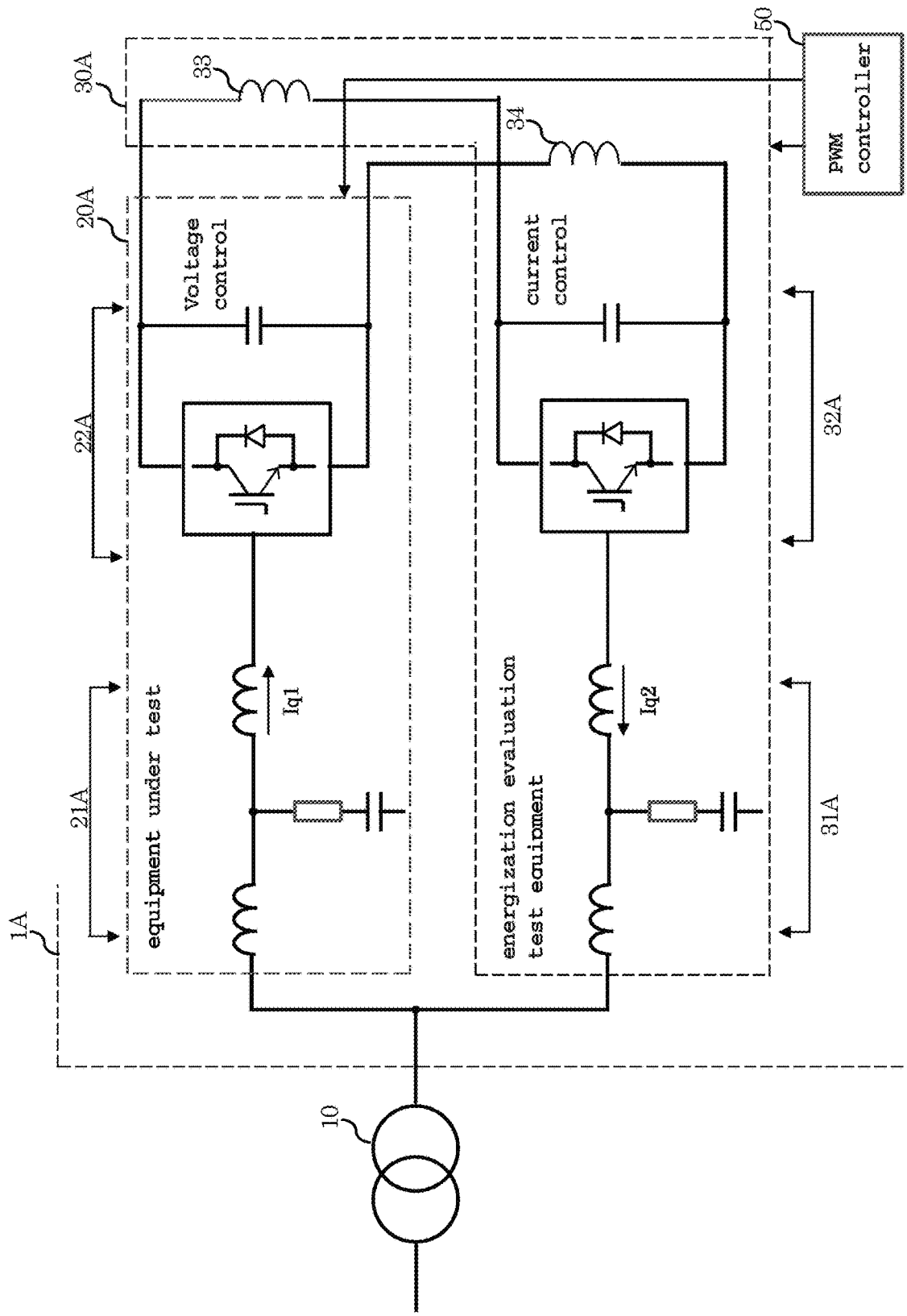
FIG. 1 A block diagram showing a test method by an energization evaluation test equipment of a PWM converter input filter according to an active current energization method by the first embodiment.

FIG. 1 is a block diagram showing a test method by the energization evaluation test system 1A of a PWM converter input filter according to an active current energization method by the first embodiment. The energization evaluation test system 1A of the PWM converter input filter according to an active current energization method shown in FIG. 1 is composed of the equipment under test 20A, the energization evaluation test equipment 30A, and the PWM controller 50. Here, the function of the PWM controller 50 may be included in either or both of the equipment under test 20A and the energization evaluation test equipment 30A.

The equipment under test 20A and the energization evaluation test equipment 30A according to the present embodiment are connected in parallel to the output of the transformer 10. The equipment under test 20A is composed of a PWM converter input filter 21A and a PWM converter 22A. The PWM converter input filter 21A and the PWM converter 22A have the same configuration as the PWM converter input filter 21C and the PWM converter 22C, respectively, these are described in the background art.

The energization evaluation test equipment 30A includes a PWM converter input filter 31A and a PWM converter 32A configured similarly to the equipment under test 20A. DC reactor 33 is connected between the positive side output terminal of the PWM converter 22A and the positive side output terminal of the PWM converter 32A, and DC reactor 34 having the same capacity as DC reactor 33 is connected between the negative side output terminal of the PWM converter 22A and the negative side output terminal of the PWM converter 32A. Since these direct current reactors are used in the input filter energization evaluation test for the PWM converter, they are shown as included in the energization evaluation test equipment in FIG. 1.

The PWM converter 22A of the equipment under test and the PWM converter 32A of the energization evaluation test equipment are controlled by the PWM controller 50. Specifically, the gate of the switching elements (for example IGBT) constituting the PWM converters 22A and 32A is controlled by the gate signal output from the PWM controller 50. An AC voltage inputs to the PWM converters 22A, 32A are converted into a DC voltage by this gate signal.

The PWM converter 22A of the equipment under test 20A performs voltage control, and the PWM converter 32A of the energization evaluation tester 30A performs current control. That is, the PWM controller 50 controls the DC voltage of the PWM converter 22A so as to be equal to the rated DC voltage of the PWM converter 22A at the time of actual load, and controls the DC output current of the PWM converter 32A so as to be equal to the rated direct current of the PWM converter 32A at the time of actual load. By controlling in this manner, it is possible to supply an effective current of a rated load to the equipment under test 20A.

According to this method, it suffices for the power system to supply energy corresponding to the losses of the equipment under test 20A and the energization evaluation test equipment 30A, and it is possible to perform a test that does not supply power equivalent to the actual load from the power system. In the first embodiment, the DC reactors 33 and 34 are provided so that the voltage control of the PWM converter 22A and the current control of the PWM converter 32A do not interfere with each other.

Embodiment 2

Figure 2:
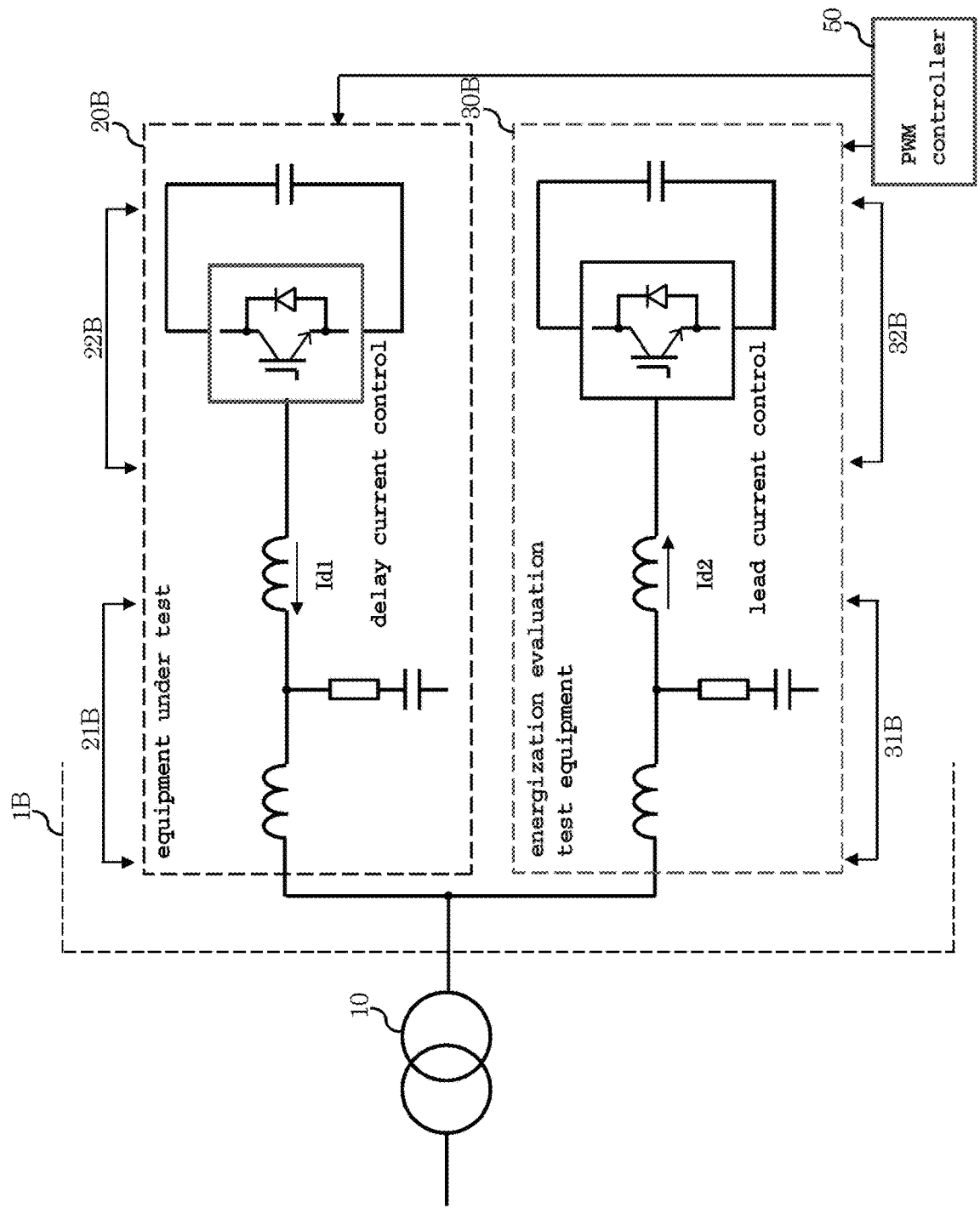
FIG. 2 A block diagram showing a test method by an energization evaluation test equipment of a PWM converter input filter according to a reactive current energization method by the second embodiment.

FIG. 2 is a block diagram showing a test method by the energization evaluation test system 1B, of the PWM converter input filter according to a reactive current energization method by second embodiment.

In the test method based on the reactive current energization method shown in FIG. 2, an equipment under test 20B and an energization evaluation test equipment 30B are connected in parallel to the output of the transformer 10 in the same manner as in the first embodiment. In the first embodiment, a direct current output of the PWM converter 22A of the equipment under test 20A and a direct current output of the PWM converter 32A of the energization evaluation test equipment 30A are connected by the direct current reactor. However, in the present embodiment, these are not connected to each other, but they are separately used. In the second embodiment, the parts other than the disconnection configuration described above are the same as those in the first embodiment, so the same reference numerals are attached to the same parts, and description thereof is omitted.

In the present embodiment, the delayed reactive current Id1 is caused to flow through the equipment under test 20B, and the lead reactive current Id2 having the same magnitude as delay reactive current Id1 flows through the energization evaluation test equipment 30B. Therefore input current from the transformer 10 cancel each other out. Controls of the delay reactive current Id1 and the lead reactive current Id2 are performed by the PWM controller 50.

Here, the reason for setting the equipment under test 20B side as the delay current and the energization evaluation equipment 30B side as the lead current is as follows. That is, assuming that the equipment under test 20B side is the leading current, the input voltage of the PWM converter 22B rises due to the impedance of the PWM converter input filter 21B. So, the setting is to prevent the modulation factor of the PWM converter 22B from becoming too high to be uncontrollable.

Figure 3:
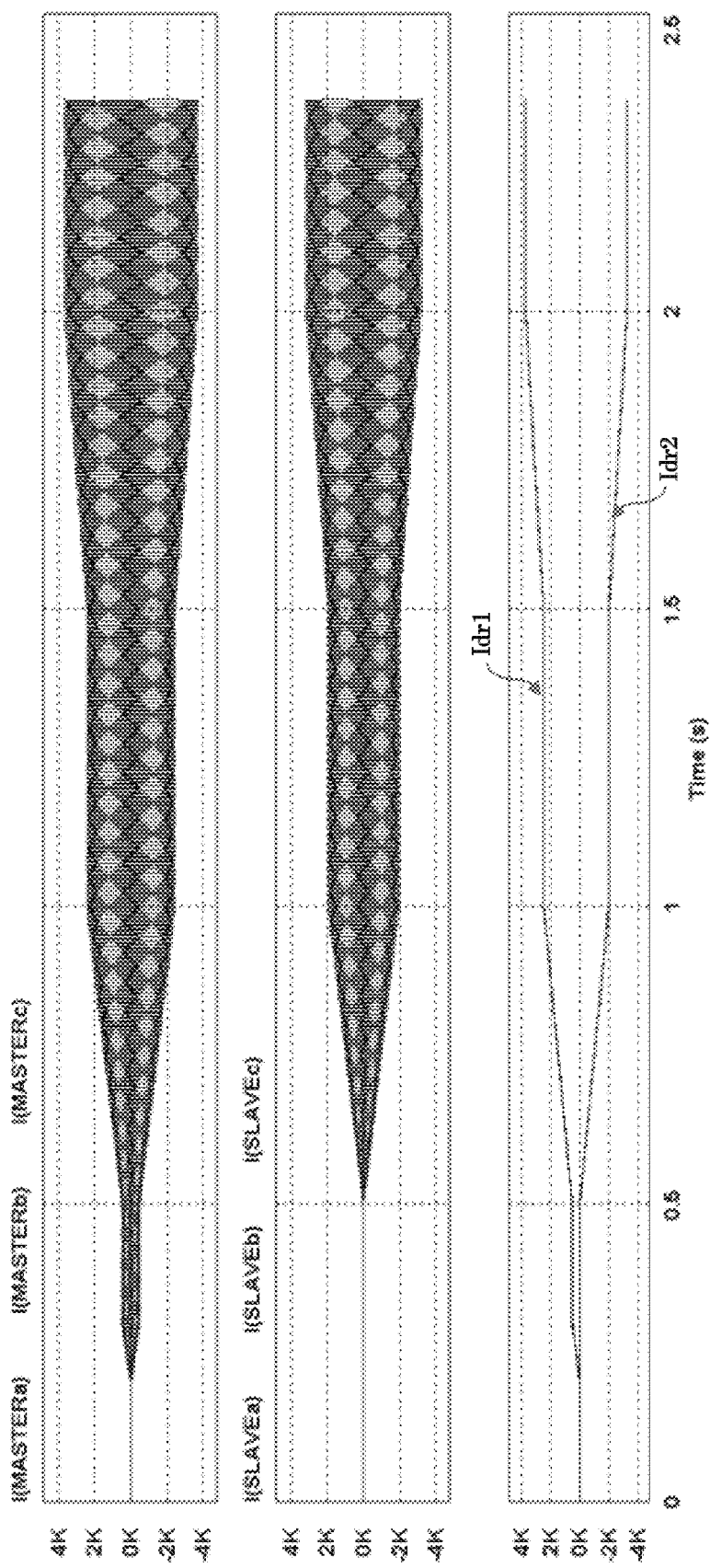
FIG. 3 Analyzed waveform by simulation with the configuration shown in FIG. 2.

FIG. 3 shows an analysis waveform obtained by simulation in the configuration shown FIG. 2. It can be seen that 3 phase Id1 (I (SLAVE a, b, c) in the figure) follows 3 phase Id2 (I (MASTER a, b, c) in the figure) when the lead current Id2 as a reactive current reference is given to the energization evaluation test equipment 30B, and the delay current Id1 as a reactive current reference is given to the equipment under test 20B. The lowermost part of FIG. 3 shows the command value Idr2 of the lead current Id2 and the command value Idr1 of the delay current in the two-axis control.

Figure 4:
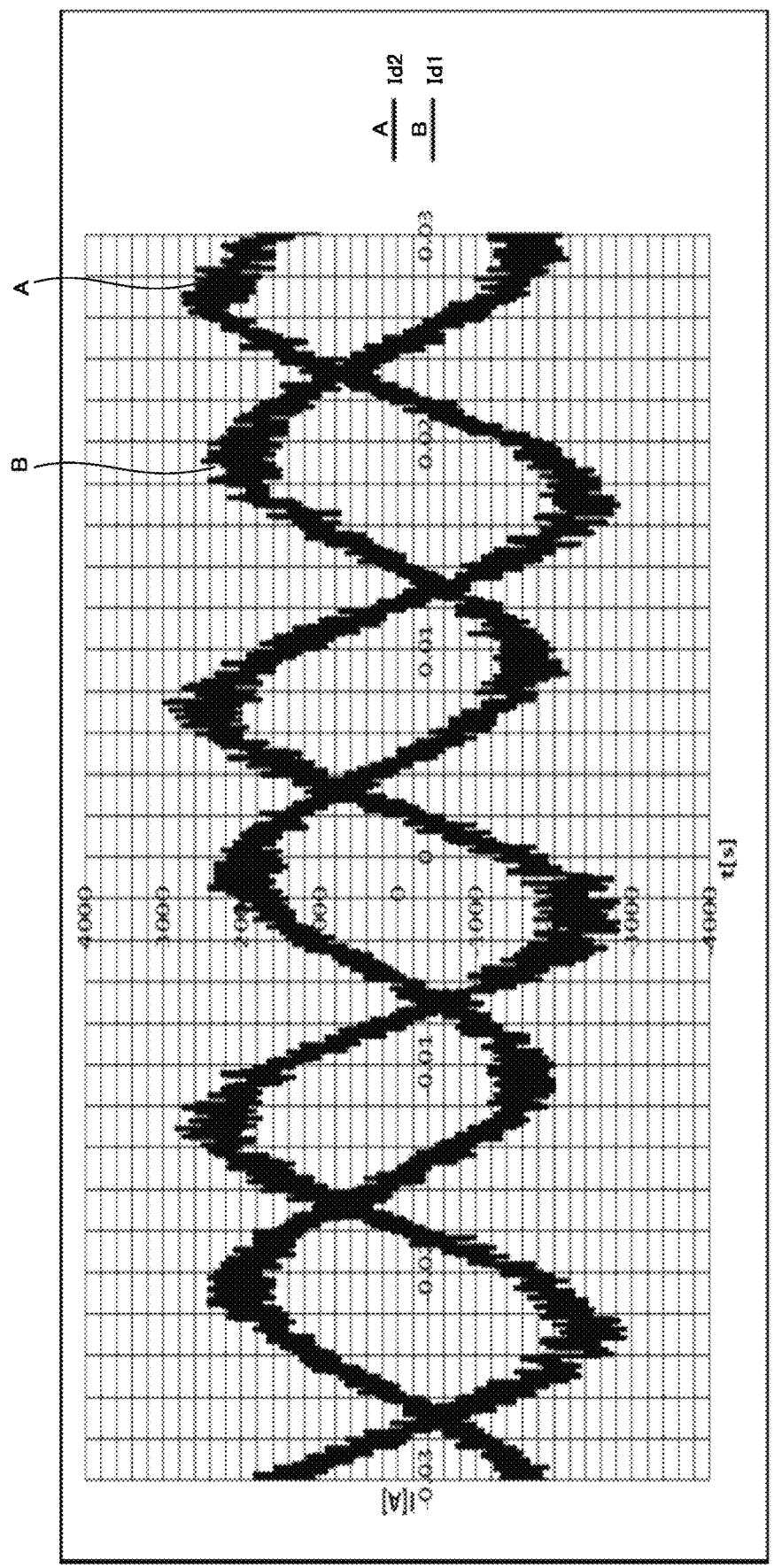
FIG. 4 Waveform in real machine with the configuration shown in FIG. 2.

FIG. 4 shows a waveform in an actual machine in the configuration shown in FIG. 2. The vertical axis is current value I [A], and the horizontal axis is time t[s]. A current waveform A is a lead current Id2 flowing through the PWM converter in input filter 31B by the lead current control of the PWM converter 32B of the energization evaluation test equipment 30B. Here, Id2 is the current waveform for one phase out of the three phases. A current waveform B is a delay current flowing through the PWM converter input filter 21B by the delay current control of the PWM converter 22B of the equipment under test 20B. Here, Id1 is the current waveform for same phase of Id2.

Both of the current waveform A and the current waveform B show the case where the working frequency is 50 [Hz]. As is clear from the figure, the phase of the current waveform B is opposite to that of the current waveform A, and the phase difference is about 180°. It can be confirmed from FIG. 4 that the test method shown in FIG. 2 can be realized. It should be noted that the slight phase deviation by 180° (phase lagging) between the current waveform A and B is due to the active current component by direct current voltage control. Therefore, if the power losses of the equipment under test 20B and the energization evaluation equipment 30B are negligibly small, the phase difference becomes 180°.

As a result, no current outflow to the system side occurs, and only the power losses of the equipment under test 20B and the energization evaluation test equipment 30B may be supplied from the power system as in the test method described in the embodiment 1 shown in FIG. 1. Therefore it is possible to reduce the power supply capacity for an equipment under test.

In addition, since the DC output of the PWM converter 22A of the equipment under test 20B and the DC output of the PWM converter 22A of the energization evaluation test equipment 30B are separated, the direct current reactor becomes unnecessary, and in terms of space cost, it is more advantageous than the embodiment 1.

As described above, according to the second embodiment of the present invention, since the power source capacity can be made small for the equipment under test, an energization evaluation test equipment can be provided to evaluate the energization evaluation at the rated voltage and the rated current of the input filter for a large capacity PWM converter.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the first embodiment, the direct current reactor 33 and the direct current reactor 34 may be a single direct current reactor. In the second embodiment, when the capacity of the smoothing capacitor of the PWM converter is insufficient, a smoothing capacitor for testing may be added in parallel. Furthermore, in the first and second embodiments, the PWM converter input filters 21A and 21B of the equipment under test are illustrated as T-type LCR filters, but they are not restricted to T-type, but only reactor L may be good in an extreme case.

DESCRIPTION OF THE SYMBOLS

Id1 delay current
Id2 lead current
1A, 1B energization evaluation test system
10 transformer
20A, 20B, 20C equipment under test
21A, 21B, 21C PWM converter input filter
22A, 22B, 22C PWM converter
30A, 30B energization evaluation test equipment
31A, 31B PWM converter input filter
32A, 32B PWM converter
33, 34 direct current reactor
40 LOAD
50 PWM controller

The invention claimed is:

1. An energization evaluation test equipment of a PWM converter input filter of an equipment under test having the PWM converter input filter connected to an output terminal of an AC power source and a PWM converter of the equipment under test connected to an output terminal of the PWM converter input filter to convert the AC power source to a DC power source, the energization evaluation test equipment comprising:
   a test equipment PWM converter input filter and a test equipment PWM converter configured similarly to the PWM converter input filter and the PWM converter of the equipment under test, respectively;
   a PWM controller for controlling the PWM converter of the equipment under test and controlling the test equipment PWM converter of the energization evaluation test equipment,
   wherein the PWM controller is performed so that an input current of the PWM converter of the equipment under test becomes a delayed current and an input current of the test equipment PWM converter of the energization evaluation test equipment becomes a lead current.

2. The energization evaluation test equipment according to claim 1, wherein
   the lead current flowing through the test equipment PWM converter input filter by the lead current control of the energization evaluation test equipment and the delay current flowing through the PWM converter input filter by the delay current control of the equipment under test are in opposite phase, and
   a phase difference between the lead current flowing through the test equipment PWM converter input filter and the delay current flowing through the PWM converter input filter is 180° when power losses of the energization evaluation test equipment and the equipment under test are negligibly small.

* * * * *